United States Patent [19]

Kelley et al.

[11] 4,311,988
[45] Jan. 19, 1982

[54] PROGRAMMABLE A-LAW AND μ-LAW DAC

[75] Inventors: Stephen H. Kelley, Tempe, Ariz.; Richard W. Ulmer, Austin, Tex.

[73] Assignee: Motorola Inc., Schaumburg, Ill.

[21] Appl. No.: 27,421

[22] Filed: Apr. 5, 1979

[51] Int. Cl.³ .................................................. H03K 13/02
[52] U.S. Cl. ............................... 340/347 DA; 307/304; 328/142; 340/347 M; 375/30
[58] Field of Search .................... 340/347 DA, 347 M; 179/15 AV; 307/304; 328/142; 375/30

[56] References Cited

U.S. PATENT DOCUMENTS

| | | | |
|---|---|---|---|
| 3,530,386 | 9/1970 | Terry | 340/347 M X |
| 3,618,073 | 11/1971 | Domchick et al. | 340/347 SY |
| 3,905,028 | 9/1975 | Wintz et al. | 179/15 AV X |
| 3,961,326 | 6/1976 | Craven | 340/347 DA X |
| 4,040,049 | 8/1977 | Messerschmitt | 179/15 AV X |
| 4,045,793 | 8/1977 | Moench | 340/347 M X |
| 4,064,506 | 12/1977 | Cartwright | 307/304 X |
| 4,129,863 | 12/1978 | Gray et al. | 340/347 AD |
| 4,231,022 | 10/1980 | Kosugi et al. | 370/109 X |

Primary Examiner—Thomas J. Sloyan
Attorney, Agent, or Firm—Anthony J. Sarli, Jr.; Vincent B. Ingrassia; Jeffrey Van Myers

[57] ABSTRACT

A companded stacked DAC is provided which can be used in an A-law or μ-law conversion merely by selection. The companded DAC is inherently monotonic and can be integrated with field effect transistors. The current sources of the DAC are switched to only one of two buses. The stacked DAC includes a chord DAC and a step DAC. The two buses which the chord DAC is connected to are maintained at approximately equal voltages by the use of a reference amplifier. The companded DAC uses successive approximation when converting.

3 Claims, 3 Drawing Figures

| CHORD | OFFSET | REFERENCE | STEP |
|---|---|---|---|
| 000 | 0 ± 0 | 16 ± 1/4 | 1 ± 1/4 |
| 001 | 16 ± 1/4 | 32 ± 1/2 | 2 ± 1/2 |
| 010 | 48 ± 3/4 | 64 ± 1 | 4 ± 1 |
| 011 | 112 ± 1 3/4 | 128 ± 2 | 8 ± 2 |
| 100 | 240 ± 3 3/4 | 256 ± 4 | 16 ± 4 |
| 101 | 496 ± 7 3/4 | 512 ± 8 | 32 ± 8 |
| 110 | 1008 ± 15 3/4 | 1024 ± 16 | 64 ± 16 |
| 111 | 2032 ± 31 3/4 | 2048 ± 32 | 128 ± 32 |

Fig 3

PROGRAMMABLE A-LAW AND μ-LAW DAC

This invention relates, in general, to digital to analog converters, and more particularly, to a companded digital to analog converter useful in a PCM codec.

Digitizing of voice signals for transmission is becoming increasingly popular. The most popular modulation scheme appears to be pulse code modulation (PCM). Specific companded PCM transmission of voice signals has become standardized through widespread use in the Bell Telephone System, μ-law, and the Consultative Committee on International Telephone and Telegraph (CCITT), A-law transfer characteristics. At the transmitting end, the voice signal must be converted from analog to digital form and then on the receiving end the digitized voice signal must be converted back to analog form.

An eight bit companded digital to analog converter (DAC) is normally used to perform μ-law or A-law pulse code modulation. Many different digital to analog converters have used bipolar transistors. Such digital to analog converters tend to consume relatively large amounts of current, and in cases where an attempt was made to reduce current consumption then settling time became a problem. There have also been DACs which used R-2R ladders which were controlled by MOS logic. The R-2R ladder has been widely used in the past. However, it tends to be difficult to place highly precise resistors in small silicon areas in order to be able to manufacture a complete codec (coder/decoder) voice transmission system. More recently, weighted capacitor analog/digital converters have become known, such as, disclosed in U.S. Pat. Nos. 4,129,863 to Gray et al. 4,129,863 is hereby incorporated herein by reference. One of the disadvantages with the weighted capacitor converter is that it uses a relatively large amount of silicon area and it must be tested dynamically.

Accordingly, it is an object of the present invention to provide an improved companded DAC useful in a PCM codec and which can controllably be use in an A-law or μ-law modulation system.

Another object of the present invention is to provide a static companded DAC.

A further object of the present invention is to provide a digital to analog converter which is inherently monotonic and which has field effect transistors.

SUMMARY OF THE INVENTION

In carrying out the above and other objects of the present invention, there is provided in one form, a stacked digital to analog converter useful for converting a digital signal to an analog output in a pulse code modulation system. A first digital to analog converter is used for converting a first portion of a digital signal to an analog signal. There is a first and a second bus coupled to the first digital to analog converter. A second digital to analog converter is coupled from an output bus to the first and second buses. The second digital to analog converter is used for converting a second portion of the digital signal. The first and second digital converters preferably include field effect transistors. Means coupled to the digital to analog converter can, upon command, cause the stacked digital to analog converter to perform μ-law or A-law conversion.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 3 is a table of cascaded accuracies useful in understanding the capabilities of the circuitry of FIG. 2.

DETAILED DESCRIPTION OF THE DRAWINGS

Figure 1:
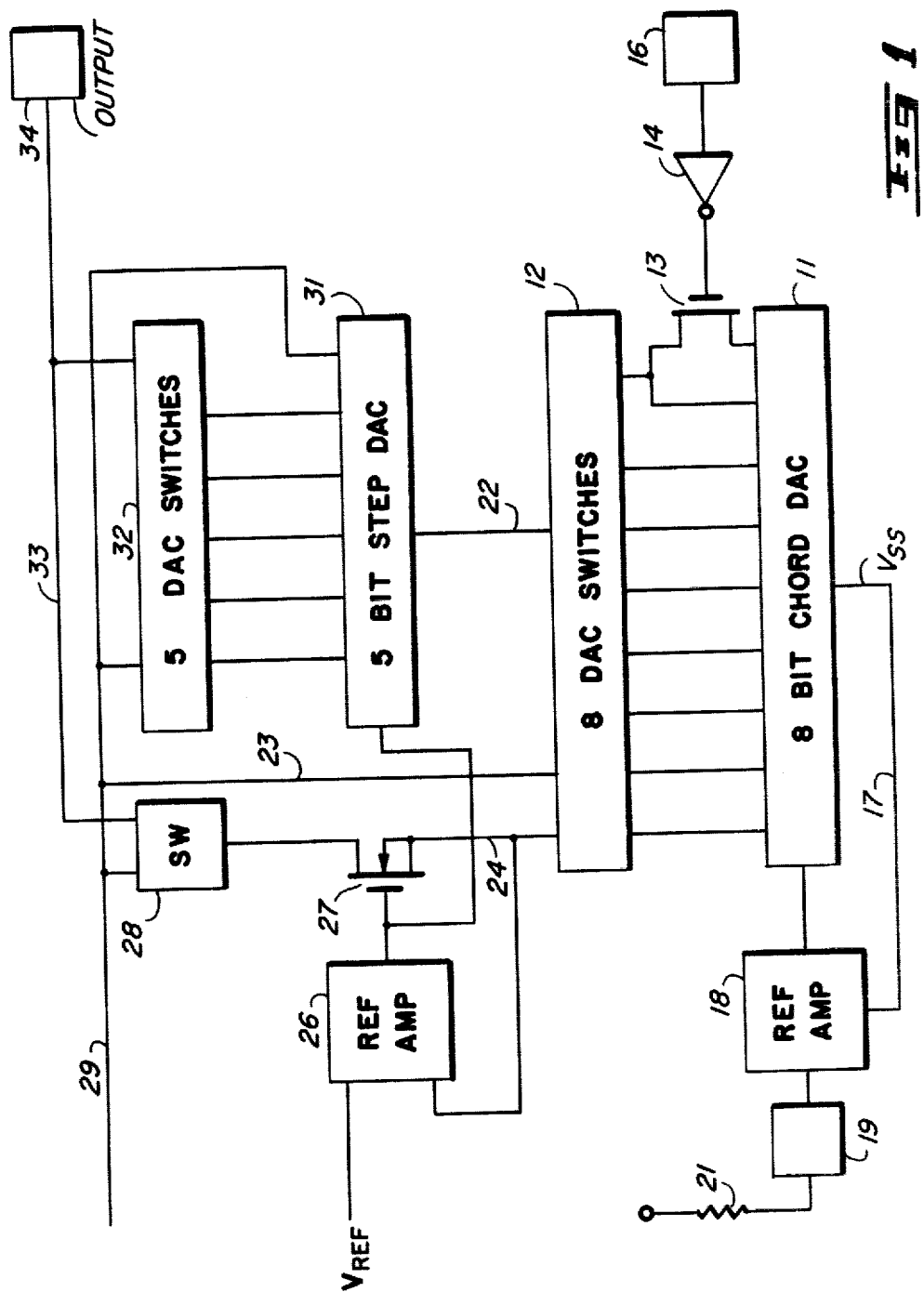
FIG. 1 is a block diagram of a stacked companded digital to analog converter.

A stacked digital to analog converter useful in a pulse code modulation codec is illustrated in block diagram form in FIG. 1. The stacked DAC has an eight bit and a five bit DAC. The eight bit DAC is known as a chord DAC while the five bit DAC is known as a step DAC. The transfer characteristics of a companding DAC is non-linear. The output of the DAC consists of eight chords eight negative chords, each chord contains 16 steps. The slopes of these chords are binarily related with the chord at the origin having steps equivalent in size to one-half of those in the adjacent chord. The output of the chord DAC is used as a pedestal upon which to build the next chord. Thus, the output will be monotonic regardless of the value of the chord current. In a companding DAC the transmitted word consists of eight bits. The first bit is used as a sign bit, the next three bits determine the chord or segment number, and the last four bits determine the step or level number within a chord. The stacked DAC of FIG. 1 is pin programmable to perform A-law or μ-law conversion.

In FIG. 1, chord DAC 11 is coupled to DAC switches 12 by a plurality of lines. One of the lines is supplemented by a current supplied through a transistor 13. Transistor 13 is used in an A-law PCM system. An enabling signal for transistor 13 is applied to an interface pin 16 and is coupled by an inverter buffer 14 to the gate electrode of transistor 13. As is well known, the A-law system is used in Europe and the μ-law system is used in the United States. Both are logarithmic and are piecewise approximated by respectively 13 and 15 straight lines. The control or enabling signal applied to interface pin 16 permits the stacked DAC of FIG. 1 to be used with either system. In the embodiment illustrated in FIG. 1, chord DAC 11 is an eight-bit DAC and DAC switches 12 includes eight switches. A current reference amplifier 18 is coupled to chord DAC 11 to provide a reference for current sources within DAC 11. The current reference for reference amplifier 18 is supplied through a terminal to resistor 21. Resistor 21 is connected to an interface terminal 19 which serves to couple resistor 21 to reference amplifier 18.

DAC switches 12 provide outputs to reference bus 22 and to output bus 24. One of the eight DAC switches 12 also passes current directly from one of the current sources in chord DAC 11 to dump bus 29. Output bus 24 goes to transistor 27 and to an input of reference amplifier 26. Reference amplifier 26 has a second input which receives a reference voltage. The output of reference amplifier 26 goes to the gate electrode of transistor 27 and to step DAC 31. Step DAC 31 is a five bit DAC. Step DAC 31 provides one output to dump bus 29 and provides five outputs to DAC switches 32. DAC switches 32 provide outputs to dump bus 29 and to a second output bus 33 which is coupled to an output interface pin 34. Bus 33 is also connected to switch 28 which serves to switch the current that flows through transistor 27 to bus 33 or to dump bus 29.

Figure 2:
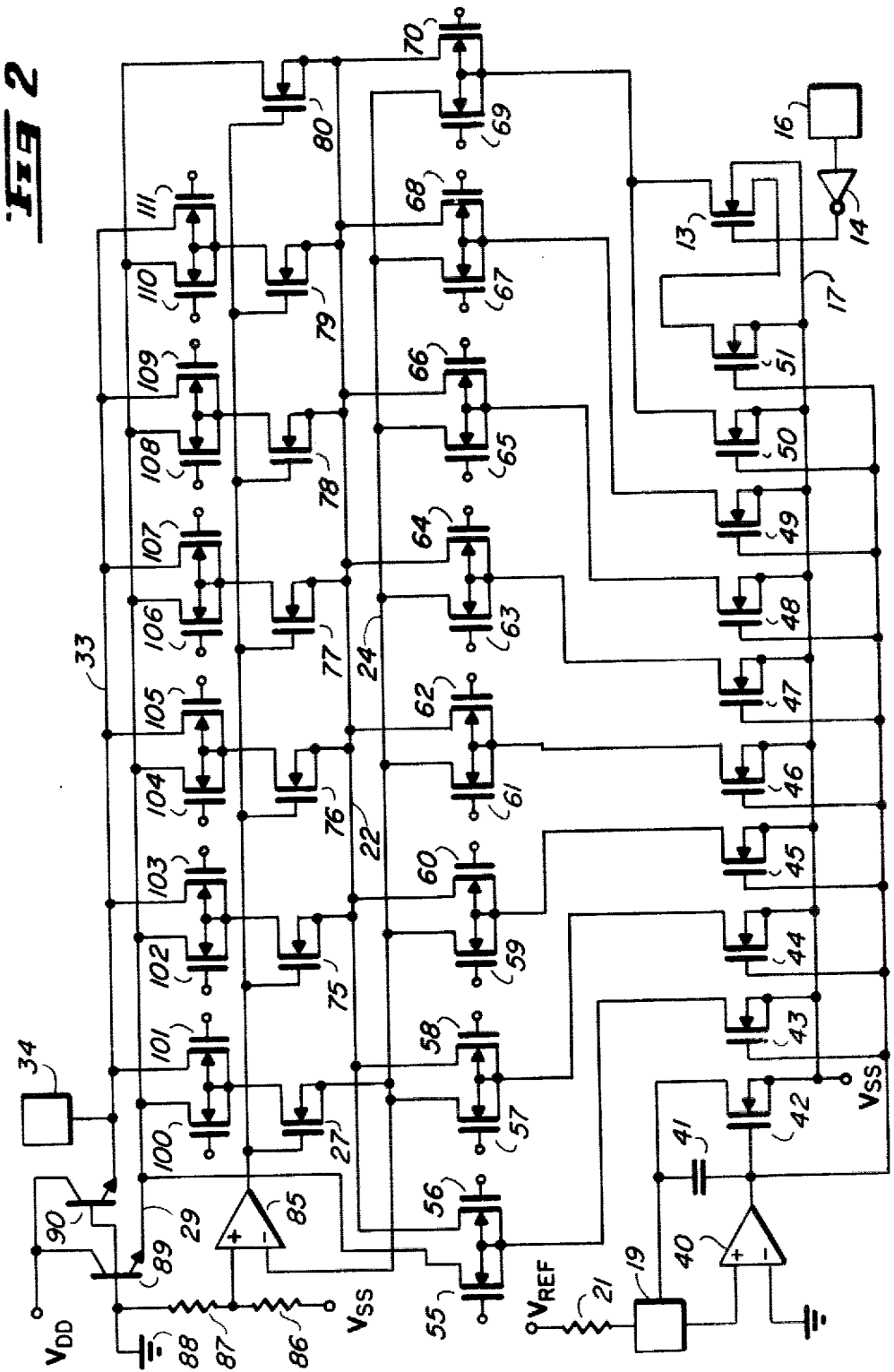
FIG. 2 is a schematic diagram of the stacked DAC shown in FIG. 1.

FIG. 2 illustrates in schematic form the stacked companded DAC of FIG. 1. Interface pin 16 receives a high logic level signal when the stacked DAC is to be used for $\mu$-law modulation and receives a low logic level signal when the stacked DAC is to be used for A-law modulation. The control signal applied to pin 16 is inverted by inverter 14 and coupled to the gate electrode of transistor 13. Transistor 13 is in series with transistor 51 and when enabled allows the current from transistor 51 to flow to a DAC switch having transistors 69 and 70.

Transistors 43 through 51 (in FIG. 2) form the chord DAC illustrated as DAC 11 in FIG. 1. One current carrying electrode of each of transistors 43 through 51 goes to one of a plurality of DAC switches which are illustrated as transistors 55 through 70. A second current carrying electrode of transistors 43 through 51 is connected to line 17 which carries voltage VSS, which is the lowest potential used in the stacked DAC.

A voltage reference is applied through resistor 21 to interface pin 19. All of the current from resistor 21 flows through transistor 42 since the input impedance of amplifier 40 is very high. Interface pin 19 is also connected to the non-inverting input of amplifier 40. The inverting input of amplifier 40 is connected to a reference potential illustrated as analog ground. The output of amplifier 40 is connected to the gate electrode of transistor 42. A capacitor 41 is connected from input terminal 19 to the output of amplifier 40. The output of amplifier 40 must be sufficient to cause transistor 42 to carry all of the current from input pin 19. The output of amplifier 40 is also connected to all the gate electrodes of transistors 43 through 51. Since amplifier 40 establishes the gate to source voltage of transistor 42 so that it will conduct all of the current from input pin 19 it also establishes the same gate voltage for transistors 43 through 51. In a preferred embodiment, transistor 42 is actually a stack of sixteen field effect transistors each being one mil square in size. Transistors 43 through 49 are similar to transistor 42 in that they each represent a stack of field effect transistors. Transistors 50 and 51 are each one field effect transistor. Transistor 49 represents two field effect transistors, transistor 48 represents four field effect transistors, transistor 47 represents eight field effect transistors, transistor 46 represents sixteen field effect transistors, transistor 45 represents thirty-two field effect transistors, transistor 44 represents sixty-four field effect transistors, and transistor 43 represents 128 stacked field effect transistors. Transistors 42 and 46 each represent a stack of sixteen field effect transistors and therefore the current flow through these transistors is exactly equal. The current flow through illustrated transistor 45 is twice as much as the current flow through illustrated transistor 42 while the current flow through illustrated transistor 44 is four times the current flow through illustrated transistor 42 and so on. On the other end, the current flow through transistor 47 is one-half the current flow through transistor 42, the current flow through transistor 48 is one-fourth, the current flow through transistor 49 is one-eighth, and the current flow through transistors 50 and 51 is one-sixteenth of the current flow through transistor 42. Transistor 51 is only used when performing an A-law modulation. Transistors 42 through 51 and transistor 13 all have their substrates connected to VSS line 17.

DAC switches 12 illustrated in FIG. 1 includes transistors 55 through 70 shown in FIG. 2. A first switch which is connected to transistor 43 has transistors 55 and 56. Transistors 55 and 56 have their sources connected to the substrate and to the drain electrode of transistor 43. The drain electrode of transistor 55 is connected to dump bus 29, and the drain electrode of transistor 56 is connected to reference bus 22. Transistors 57 and 58 have their source electrodes connected to the drain electrode of transistor 44. The drain electrode of transistor 57 is connected to output bus 24, and the drain electrode of transistor 58 is connected to reference bus 22. Transistors 57 and 58 can switch the current that flows through transistor 44 to bus 24 or to bus 22 respectively. Transistors 59 and 60 have their sources connected to the drain electrode of transistor 45. The drain electrode of transistor 59 is connected to output bus 24, and the drain electrode of transistor 60 is connected to reference bus 22. Transistors 61 and 62 have their source electrodes coupled to the drain electrode of transistor 46. Transistor 61 has its drain electrode connected to bus 24, and transistor 62 has its drain electrode connected to bus 22. Transistors 63 and 64 have their source electrodes connected to the drain electrode of transistor 47. Transistor 63 has its drain electrode connected to bus 24, and transistor 64 has its drain electrode connected to bus 22. Transistors 65 and 66 have their source electrodes connected to the drain electrode of transistor 48. Transistor 65 has its drain electrode connected to bus 24, and transistor 66 has its drain electrode connected to bus 22. Transistors 67 and 68 have their source electrodes connected to the drain electrode of transistor 49. Transistor 67 has its drain electrode connected to bus 24, and transistor 68 has its drain electrode connected to bus 22. Transistors 69 and 70 have their source electrodes connected to the drain electrode of transistor 50 and to the drain electrode of transistor 13. The drain electrode of transistor 69 is connected to bus 24, and the drain electrode of transistor 70 is connected to bus 22. The gate electrodes of transistors 55 through 70 are enabled by logic signals derived from three bits of the eight bit digital word being converted to an analog signal. As an example, transistors 55, 57, 59, 61, 63, 65, 67, and 69 can be enabled by the signals generated from the three bits while transistors 56, 58, 60, 62, 64, 66, 68, and 70 can be enabled by complements of the signals generated from the three bits.

Output bus 24 is coupled by transistor 27 to a step DAC switch having transistors 100 and 101. Output bus 24 is also connected to the inverting input of an amplifier 85. The non-inverting input of amplifier 85 is connected to a reference voltage which is derived from a voltage divider made by series connected resistors 86 and 87. Resistors 86 and 87 are connected between line 88 and voltage potential VSS. Line 88 is connected to a voltage reference such as ground. The output of amplifier 85 is connected to gate electrodes of transistor 27 and transistors 75 through 80. Reference amplifier 85 monitors the voltage on output bus 24 and establishes the voltage on a reference bus 22 by establishing the gate source voltage for transistors 27 and 75 through 80. Transistor 75 has its source connected to bus 22 and its drain connected to source electrodes of transistors 102 and 103. Transistor 102 has its drain electrode connected to bus 29, and transistor 103 has its drain electrode connected to bus 33. Transistor 76 has its source electrode connected to bus 22 and has its drain electrode connected to the source electrodes of transistors 104 and 105. Transistor 104 has its drain electrode connected to bus 29, and transistor 105 has its drain electrode connected to bus 33. Transistor 77 has its source electrode connected to bus 22 and has its drain electrode connected to the source electrodes of transistors 106 and 107. Transistor 106 has its drain electrode connected to bus 29, and transistor 107 has its drain electrode connected to bus 33. Transistor 78 has its source electrode connected to bus 22 and has its drain electrode connected to the source electrodes of transistors 108 and 109. Transistor 108 has its drain electrode connected to bus 29, and transistor 109 has its drain electrode connected to bus 33. Transistor 79 has its source electrode connected to bus 22 and has its drain electrode connected to source electrodes of transistors 110 and 111. Transistor 110 has its drain electrode connected to bus 29, and transistor 111 has its drain electrode connected to bus 33. Transistors 102 through 111 form five DAC switches for the upper DAC. Transistor 80 is coupled directly between bus 29 and bus 22. Transistor 27 and transistors 75 through 78 are formed by stacks of field effect transistors as are the current source transistors of the lower DAC. Transistor 27 represents a stack of thirty-two field effect transistors, transistor 75 represents a stack of sixteen field effect transistors, transistor 76 represents a stack of eight field effect transistors, transistor 77 represents a stack of four field effect transistors, transistor 78 represents a stack of two field effect transistors, and transistors 79 and 80 each comprise one field effect transistor. Each individual transistor in upper DAC is also one mil square in the preferred embodiment. The switching transistors 55 through 70 and 100 through 111 are ratioed transistors so that they can handle the required current.

Dump bus 29 is connected to an emitter of an NPN transistor 89. The base of transistor 89 goes to ground terminal 88 and the collector of transistor 89 goes to voltage terminal $V_{DD}$. Output bus 33 is connected to output interface pin 34 and to the emitter of an NPN transistor 90. NPN transistor 90 has its base connected to ground terminal 88 and its collector connected to voltage terminal $V_{DD}$. Emitter followers 89 and 90 are easily formed by the CMOS process if their collectors are connected to the most positive voltage in the circuit, which in the case illustrated is $V_{DD}$. Transistors 102 through 109 are enabled by bits supplied to their gate electrodes which are the least significant four bits, and their complements, of the eight bit voice word being converted. Transistors 100, 101, 110 and 111 are controlled by signals supplied to their gate electrodes which are derived by control circuitry of the codec system employing the stacked DAC.

When an eight bit word is received to be converted the lower DAC of the stacked DAC is the chord DAC and is used to determine the chord. During the search for the proper chord it may be determined that some of the higher current sources are not needed. As an example, if the current source represented by transistor 43 is not needed, transistor 55 will be enabled so that the current from transistor 43 will be delivered to dump bus 29. If the current source represented by transistor 44 is not required transistor 57 will be enabled thereby placing the current from current source 44 onto bus 24 which can then be passed to bus 29 by transistors 27 and 100. Once the chord has been determined, the unneeded current sources can then be disabled by removing the enabling signal from an associated switching transistor, which will be one of the transistors 55 through 70. The current sources left enabled to establish the chord will be used by the step DAC, which is the upper portion of the stacked DAC, to determine the specific step within the chord. The current supplied by the chord DAC will be used as an offset or pedestal by the step DAC. Once a digital voice word has been converted by the stacked DAC, the analog current will appear via bus 33 to output interface pin 34. Pin 34 is connected to a comparator within an analog subsystem of the codec. It should be noted that transistor 27 is a stack of thirty-two individual field effect transistors whereas the total of the individual field effect transistors represented by transistors 75 through 80 also equals thirty-two. This is important since now transistor 27 will have the same gate to source voltage as will the total of transistors 75 through 80. Note that the source electrode of transistor 27 is connected to bus 24 while the source electrodes of transistors 75 through 80 are connected to bus 22. This establishes that buses 22 and 24 are at approximately the same voltage so that all the drain electrodes of switch transistors 55 through 70 will be at approximately the same voltage so that the switching transistor that switches the associated current source from bus 22 to 24 will not cause a substantial change in current density through the current source transistor. This balancing voltage effect between buses 22 and 24 is maintained by reference amplifier 85 which senses the voltage on bus 24 and produces the gate voltages for transistors 27 and 75 through 80.

FIG. 3 is a table illustrating the eight different chords that the stacked DAC of FIG. 2 must be able to locate. The information contained in the table of FIG. 3 relates to $\mu$-law modulation. There are eight chords or segments in $\mu$-law and these are expressed in digital form by 000 through 111. These appear in the left-hand column under the heading CHORD. The second column under the heading OFFSET shows the offset for each chord. The offset is sometimes called the pedestal. For chord 001 the offset is 16 meaning that chord 001 starts at a level of 16. The third column is a REFERENCE or span column and shows the span of each chord. The fourth column is the STEP column and shows the number of units in each step for a particular chord. Going back to chord 001, the offset is 16, the span is 32 meaning that chord 001 spans from level 16 to 48. Since each chord is divided up into 16 parts each step within the 32 span will be in increments of two as indicated in the STEP column. The table of FIG. 3 is a tabulation for a six bit accurate set of chord currents in a six bit accurate conventional step DAC showing the offset, reference, and step errors. As an example of how such high offsets can be achieved it should be noted that transistor 50 which represents a single field effect transistor can carry one unit of current since the current reference transistor 42 comprises 16 field effect transistors. On the same basis, transistor 49 which represents two field effect transistors will then carry two units of current since it is twice as large as transistor 50. The same applies for the other current source transistors since they increase in size going from transistor 50 to 43.

As stated hereinbefore the binary bits for the chords are obtained from an eight bit word, wherein, the first bit is the sign bit, the next three bits represent the chord of the word, and the remaining four bits (which are the least significant bits) determine the step within the chord. It should be noted that transistors 110 and 111 are only used when the stacked DAC is used as a digital to analog converter, and when the stacked DAC is used for analog to digital conversion transistors 110 and 111 are not used.

By now it should be appreciated that there has been provided a stacked DAC which can process either A-law or μ-law modulation by way of input pin selection; the companded DAC is static; the DAC is inherently monotonic since a 16 unit reference device (transistor 42) is the span of chord 0 and is produced by the one unit device (transistor 50) which is also the same one unit device used when in a higher chord and the one unit device is used as the offset or pedestal. So no matter what the accuracies of the match between the transistors is, the same transistor is used from one chord to the next.

We claim:

1. An MOS companded digital to analog converter for converting a digital PCM word to an analog signal, comprising:
    a chord DAC for providing, in response to a chord portion of the PCM word, an output current to an intermediate node and a reference current to a reference node, comprising:
        a first ordered plurality of current sources, each of the first current sources providing a current twice as large as the next lower of the first current sources; and
        a first ordered plurality of switches, the highest ordered of which selectively couples the highest ordered of the first current sources to a dump node in response to the chord portion of the PCM word and to the reference node otherwise, the lowest ordered of which selectively couples the lowest ordered of the first current sources to the reference node in response to the chord portion of the PCM word and to an intermediate node otherwise, and the balance of which selectively couple a respective successively ordered one of the first current sources to the reference node in response to the chord portion of the PCM word and to the intermediate node otherwise;
    a first reference source coupled to each of the first current sources, for controlling the current levels of the first current sources;
    a code current source selectively coupled to the lowest ordered of the first switches, in response to a code enable signal for providing A-law PCM conversion;
    a step DAC for coupling, in response to a step portion of said PCM word, a portion of the reference current from the reference node to an output node, and the balance of the reference current from the reference node to the dump node, comprising:
        a second, ordered plurality of current sources, each of the second current sources providing a current twice as large as the next lower of the second current sources, the highest ordered of which is coupled to the intermediate node, the lowest ordered of which is coupled between the reference node and the dump node, and the balance of which are coupled to the reference node; and
        a second, ordered plurality of switches, the highest ordered of which couples the highest ordered of the second current sources to the output node in response to an enable signal and to the dump node otherwise, and the balance of which selectively couple a respective one of the second current sources to the output node in response to the step portion of the PCM word and to the dump node otherwise; and
    a second reference source coupled to the intermediate node and to each of the second current sources, for controlling the voltage potential of the intermediate node.

2. A digital to analog converter for converting signals from a digital PCM word to an analog output, comprising:
    a chord DAC for providing, in response to a chord portion of the PCM word, an output current to an intermediate node and a reference current to a reference node, comprising:
        a first ordered plurality of current sources, each of the first current sources providing a current twice as large as the next lower of the first current sources; and
        a first ordered plurality of switches, the highest ordered of which selectively couples the highest ordered of the first current sources to a dump node in response to the chord portion of the PCM word and to the reference node otherwise, the lowest ordered of which selectively couples the lowest ordered one of the first current sources to the reference node in response to the chord portion of the PCM word and to an intermediate node otherwise, and the balance of which selectively couple a respective successively ordered one of the first current sources to the reference node in response to the chord portion of the PCM word and to the intermediate node otherwise;
    a first reference source coupled to each of the first current sources, for controlling the current levels of the first current sources;
    a code current source selectively coupled to the lowest ordered of the first switches in response to a code enable signal, for providing A-law PCM conversion;
    a step DAC for coupling, in response to a step portion of the PCM word, a portion of the reference current from the reference node to an output node, and the balance of the reference current from the reference node to the dump node, comprising:
        a second, ordered plurality of current sources, each of the second current sources providing a current twice as large as the next lower one of the second current sources, the lowest ordered of which is coupled between the reference node and the dump node, and the balance of which are coupled to the reference node; and
        a second, ordered plurality of switches, for selectively coupling a respective one of the second current sources to the output node in response to the step portion of the PCM word and to the dump node otherwise; and
    a second reference source coupled to the intermediate node and each of the second current sources, for controlling the voltage potential at the intermediate node.

3. The digital to analog converter of claim 2 further including:
    an additional current source in the second, ordered plurality of current sources coupled to the intermediate node, for providing a current twice as large as the highest ordered of the second current sources; and
    an additional switch in the second, ordered plurality of switches which couples the additional current source to the output node in response to an enable signal and to the dump node otherwise.

* * * * *